(12) United States Patent
Gosche

(10) Patent No.: US 7,815,065 B2
(45) Date of Patent: Oct. 19, 2010

(54) TELECOMMUNICATIONS ENCLOSURE SYSTEM

(76) Inventor: Chris Gosche, 1401 Brown Deer Ct., Apopka, FL (US) 32712

( * ) Notice: Subject to any disclaimer, the term of this patent is extended or adjusted under 35 U.S.C. 154(b) by 831 days.

(21) Appl. No.: 11/675,778

(22) Filed: Feb. 16, 2007

(65) Prior Publication Data

US 2008/0197129 A1    Aug. 21, 2008

(51) Int. Cl.
   B65D 6/28     (2006.01)
   B65G 1/00     (2006.01)
   A47F 7/00     (2006.01)

(52) U.S. Cl. ............... 220/4.02; 211/85.8; 414/267

(58) Field of Classification Search ........... 220/4.02; 414/267, 623; 211/85.8, 187, 41.12, 70.1, 211/190, 153

See application file for complete search history.

(56) References Cited

U.S. PATENT DOCUMENTS

| | | | |
|---|---|---|---|
| 4,729,614 A | 3/1988 | Nadler et al. | |
| 4,823,381 A | 4/1989 | Olson | |
| 5,568,362 A | 10/1996 | Hansson | |
| 5,683,001 A | 11/1997 | Masuda et al. | |
| 5,816,672 A | 10/1998 | LaPointe et al. | |
| 5,959,250 A | 9/1999 | Daoud | |
| 6,123,203 A | 9/2000 | Gibbons | |
| 6,129,429 A | 10/2000 | Hardt et al. | |
| 6,181,549 B1 | 1/2001 | Mills et al. | |
| 6,209,979 B1 | 4/2001 | Fall et al. | |
| 6,364,439 B1 | 4/2002 | Cedillo | |
| 6,449,141 B1 | 9/2002 | Hartel | |
| 6,467,640 B1* | 10/2002 | Hung | 220/4.02 |
| 6,480,391 B1 | 11/2002 | Monson et al. | |
| 6,498,293 B2* | 12/2002 | Marchand et al. | 174/50 |
| 6,515,225 B1* | 2/2003 | Wright | 174/50 |
| 6,527,135 B1 | 3/2003 | Braun et al. | |
| 6,603,660 B1 | 8/2003 | Ehn et al. | |
| 6,842,349 B2 | 1/2005 | Wrycraft et al. | |
| 6,925,843 B1 | 8/2005 | Pols Sandhu et al. | |
| 2001/0030881 A1* | 10/2001 | Yamaguchi et al. | 363/124 |
| 2002/0030981 A1 | 3/2002 | Sullivan et al. | |
| 2002/0195261 A1 | 12/2002 | Harrison et al. | |
| 2004/0129043 A1 | 7/2004 | Squier | |
| 2005/0162838 A1 | 7/2005 | Mayer | |
| 2005/0189132 A1 | 9/2005 | Stoller et al. | |
| 2006/0103270 A1 | 5/2006 | Bergesch et al. | |

* cited by examiner

*Primary Examiner*—Anthony Stashick
*Assistant Examiner*—Shawn M Braden
(74) *Attorney, Agent, or Firm*—McKinney Law, PLLC

(57) ABSTRACT

Telecommunications enclosure system comprising a first enclosure and second enclosure with each halving a pair of vertical mounting flanges. Bach mounting flange comprises a row of identical round apertures with a slotted aperture disposed at the end of each row of round apertures so that a bolt or screw is used to mount first enclosure to a backboard or equipment rack enclosing pre-selected equipment. The first enclosure further comprising a plurality of U-shaped perforated knock-outs so that existing cabling can be routed outside said first enclosure. The telecommunications enclosure system is configured to mount on an equipment rack having a first side and second side wherein said first enclosure is mounted on said first side of said telecommunications rack and said second enclosure is mounted on said second side of said telecommunications equipment rack so that telecommunications equipment is completely enclosed on all sides thereby preventing unauthorized access.

13 Claims, 11 Drawing Sheets

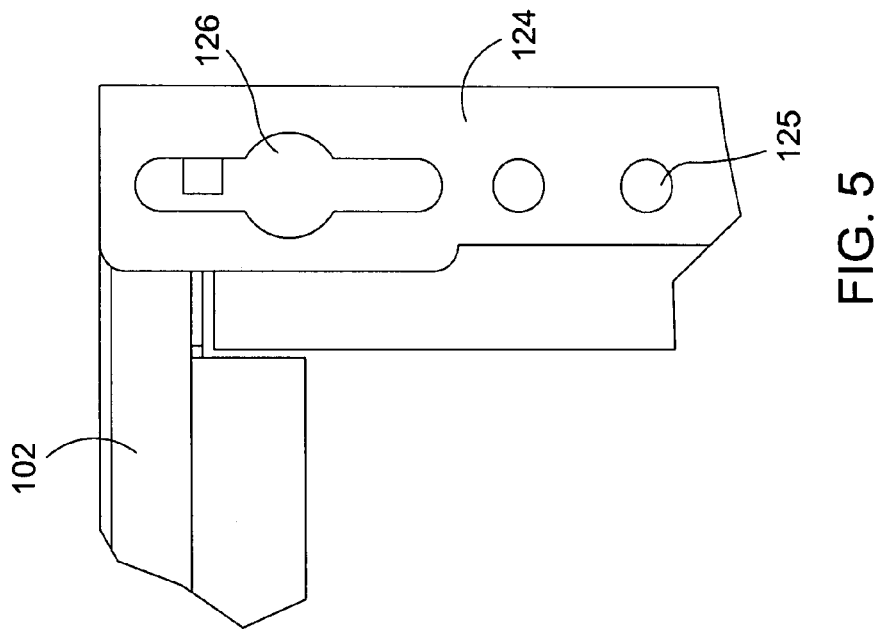
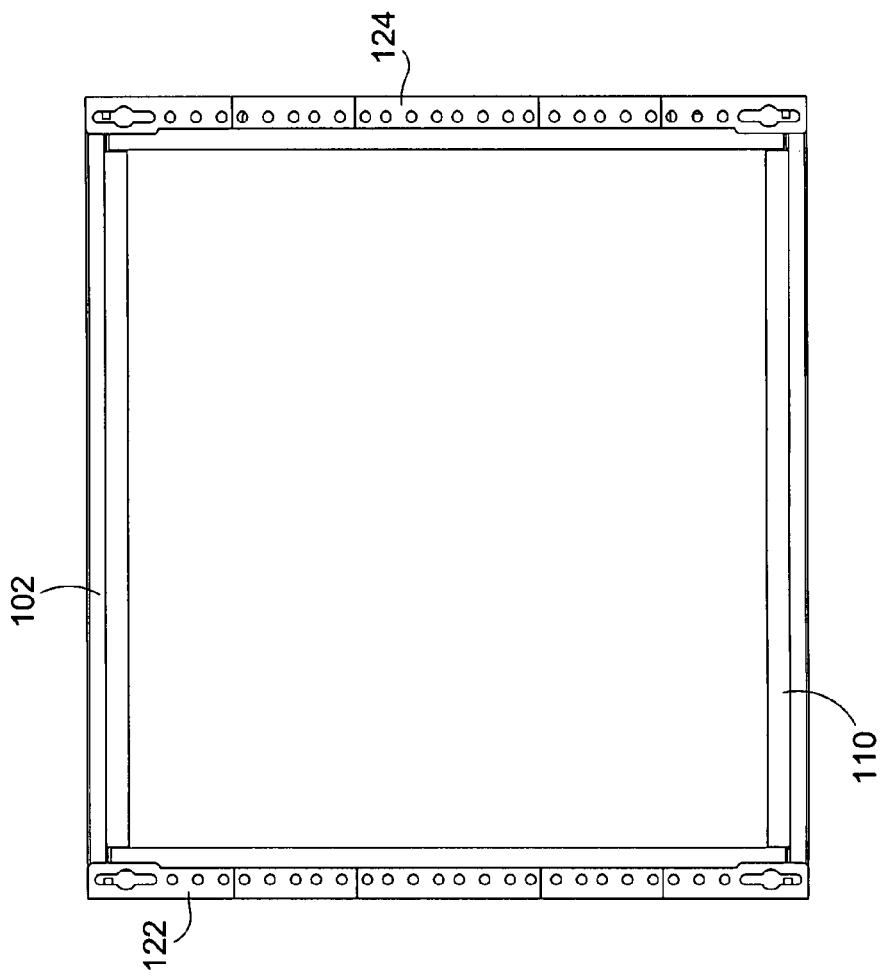
FIG. 5
FIG. 4

TELECOMMUNICATIONS ENCLOSURE SYSTEM

FIELD OF THE INVENTION

The present invention relates generally to an enclosure for telecommunication equipment, and more specifically to an enclosure system for installation over existing voice and data cabling equipment without disconnecting and re-terminating connections.

DESCRIPTION OF THE PRIOR ART

Sensitive electronic equipment for commercial buildings is typically mounted on a wall or installed in a rack or enclosure pursuant to the Telecommunications Industry Association ("TIA") and Electronic Industries Alliance ("EIA") standards. The TIA/EIA standards specify the minimum requirements for mounting telecommunications cabling. The telecommunications equipment includes, but is not limited to, computer network interfaces, junction boxes and other forms of voice and data cabling equipment. Electronic enclosures are typically used to limit access to electronic equipment and when security is an issue. Sometimes electronic enclosures are also installed for aesthetic purposes or for moisture protection.

There have been attempts to improve telecommunications enclosures such that the water resistance is improved. By way of example, note U.S. Pat. No. 6,527,135 to Braun et al., that discloses a water resistant enclosure providing protection to low voltage system or electronic equipment by using a three-sided removable cover and an enclosure door that covers the front opening. A shortcoming of this prior art is that to provide a retrofit installation, the existing cabling that is terminated at the equipment must be removed and re-terminated, which interrupts the service.

Another example is U.S. Pat. No. 5,568,362, to Hansson that discloses a cabinet comprised of a central casing, a door, and a partition wall defining a connector chamber inside the central casing behind the door and housing the jacks. However, Hansson is not adaptable to mount on a rack or mounting over existing electronic equipment installations.

U.S. Pat. No. 4,823,381 to Olson discloses a security cover for a conventional telephone installation backboard, characterized by use of a pair of mounting members attachable to the backboard, one of which includes a hinged door panel. A shortcoming of this prior art is that it is not adaptable to installation on either a backboard or an electronics rack thereby limiting its application. Similarly, U.S. Publication No. US 2002/0195261 to Harrison et al., discloses an enclosure, which has a back, front, and side walls, with all connections internal. However, it is limited in application.

Another example is U.S. Publication No. US 2006/0103270 to Bergesch et al., that discloses a containment bracket and enclosure for low voltage components. A shortcoming of this prior art is that it is not adaptable to enclose existing electronics installed on a backboard.

U.S. Pat. No. 4,729,614 to Nadler et al. discloses a cover for a cabinet having an exposed portion to which access can be controlled. Again, this prior art is not adaptable to different application of a backboard installation or rack installation of electronics equipment.

Notwithstanding the existence of such prior art telecommunications enclosures, there is a need for an improved enclosure that is adaptable to retrofit existing equipment and cabling installations and a telecommunications enclosure having improved security capabilities.

It is, therefore, to the effective resolution of the aforementioned problems and shortcomings of the prior art that the present invention is directed.

However, in view of the prior art at the time the present invention was made, it was not obvious to those of ordinary skill in the pertinent art how the identified needs could be fulfilled.

SUMMARY OF THE INVENTION

This invention is a telecommunications enclosure system comprising a first enclosure having a first top plate, a first bottom plate parallel and opposing said top plate, a first sidewall disposed perpendicular between said top plate and said bottom plate and a second sidewall parallel and opposing said first side wall and disposed perpendicular between said top plate and said bottom plate so that a first rectangular aperture is defined and formed therein; said first sidewall and second sidewall enclosure having a pair of vertical mounting flanges wherein each said mounting flange comprises a row of identical round apertures with a slotted aperture disposed at the end of each row of round apertures so that a bolt or screw is used to mount first enclosure to a backboard or equipment rack enclosing pre-selected equipment; said first enclosure further comprising a plurality of U-shaped perforated knock-outs so that existing cabling can be routed outside said first enclosure; and a first removable door hingedly attached to said second sidewall of said first enclosure so that said door in a closed position prevents access to said rectangular aperture and pre-selected equipment contained therein from a front side.

The telecommunications system enclosure system further comprises a second enclosure having a top plate, a bottom plate parallel and opposing said top plate, a first sidewall disposed perpendicular between said top plate and said bottom plate, and a second sidewall parallel and opposing said first sidewall and disposed perpendicular between said top plate and said bottom plate so that a second rectangular aperture is defined and formed therein; said first sidewall and second sidewall of second enclosure having a pair of vertical mounting flanges wherein each said mounting flange comprises a row of identical round apertures with a slotted aperture disposed at the end of each row of round apertures so that a bolt or screw is used to mount second enclosure to a backboard or equipment rack; and a second door hingedly attached to said second sidewall of said second enclosure so that said second door in a closed position prevents access to said second rectangular aperture from a front side.

The telecommunications enclosure system is configured to mount on an equipment rack having a first side and second side wherein said first enclosure is mounted on said first side of said telecommunications rack and said second enclosure is mounted on said second side of said telecommunications equipment rack so that telecommunications equipment is completely enclosed on all sides thereby preventing unauthorized access.

The telecommunications enclosure system is assembled using bolts and/or screws in the preferred embodiment. However, in alternative embodiments the means to assemble the enclosure system include welding and other similar means well known in the art.

It is therefore an object of the present invention to provide for an improvement that overcomes the aforementioned inadequacies of the prior art and provides a significant contribution to the advancement of telecommunications enclosures.

Another object of the present invention is to provide a telecommunications enclosure with the improved ability to be mounted over existing voice and data cabling installations.

Another object of the present invention is to provide a telecommunications enclosure that mounts on EIA/TIA rails and has the depth required to leave existing patch panels and wire managers in place.

Another object of the present invention is to provide a telecommunications enclosure that utilizes slotted holes for installation on a rack.

Another object of the present invention is to provide a telecommunications enclosure that fully encloses a section of a standard EIA/TIA relay rack.

Another object of the present invention is to provide a telecommunications enclosure that is adaptable to enclose strategic sections on a rack.

Still another object of the present invention is to provide a telecommunications enclosure that is adaptable to mount in the front and rear portions of a rack.

Yet another object of the present invention is to provide a telecommunications enclosure that has the ability to seal off the area between the rack mounting rails and creating a fully enclosed rack.

Another object of the present invention is to provide a telecommunications enclosure that meets airflow requirements of the electronics equipment.

Another object of the present invention is to provide a telecommunications enclosure with a fan to cool sensitive electronics equipment.

Another object of the present invention is to provide a telecommunications enclosure that is adaptable to install over existing equipment mounted to a backboard or a rack utilizing the same enclosure system.

Another object of the present invention is to provide a telecommunications enclosure that improves security and controls access to the electronics equipment.

Another object of the present invention is to provide a telecommunications enclosure that is adaptable for both new and existing cabling installations.

Another object of the present invention is to provide a telecommunications enclosure with a removable door for improving the efficiency of the installation of the enclosure Both the foregoing general description and the following detailed description are explanatory and are not restrictive of the invention as claimed. The accompanying drawings, which are incorporated in and constitute part of the specification, illustrate embodiments of the present invention and together with the general description, serve to explain principles of the present invention.

These and other important objects, advantages, and features of the invention will become clear as this description proceeds.

The invention accordingly comprises the features of construction, combination of elements, and arrangement of parts that will be exemplified in the description set forth hereinafter and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which:

FIG. 4 is a rear view of a first enclosure of the present invention;

FIG. 5 is a rear partial view of a first enclosure of the present invention;

DETAILED DESCRIPTION OF THE PREFERRED EMBODIMENT

Figure 1:
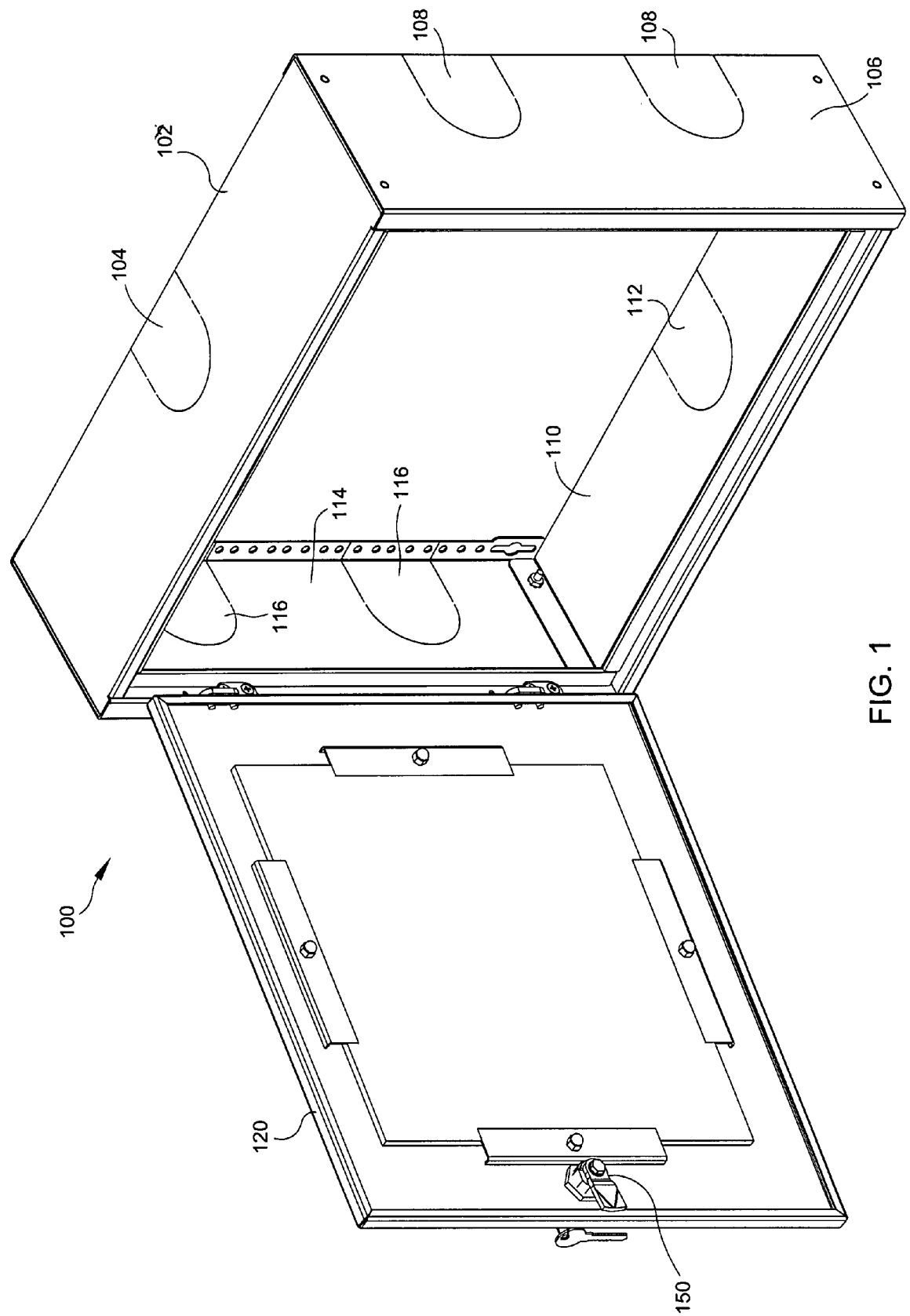
FIG. 1 is a perspective view of a first enclosure of the present invention in an open position.
Figure 2:
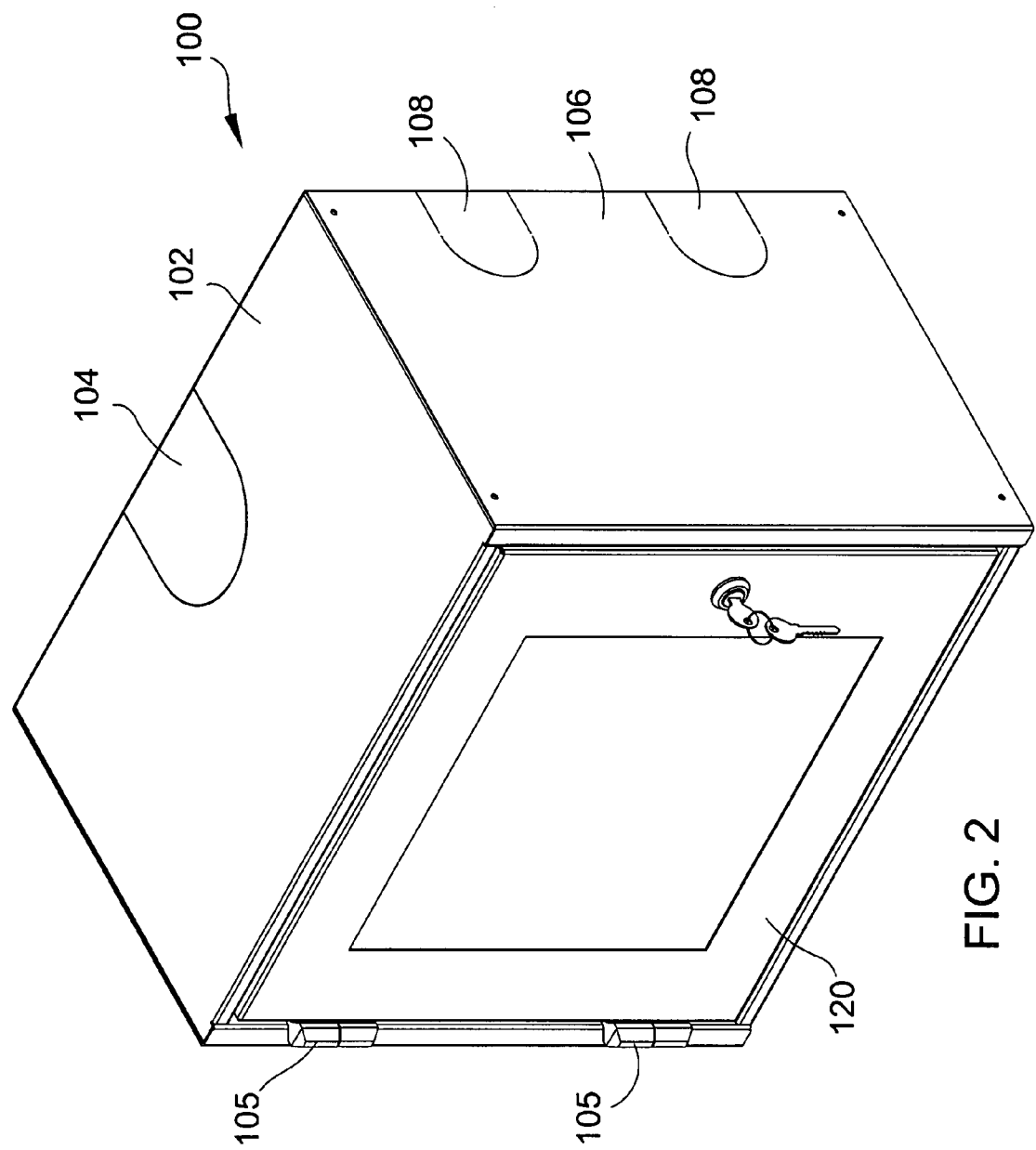
FIG. 2 is a perspective view of a first enclosure of the present invention in a closed position.

FIG. 1 and FIG. 2 show an enclosure system that comprises generally a rigid, rectangular shaped first enclosure 100. The first enclosure 100 is properly sized so that it can be placed over desired electronic equipment mounted on a TIA/EIA rack or backboard. The first enclosure 100 has a top plate 102, a bottom plate 110, a first sidewall 106 and opposing second sidewall 114. Once first enclosure 100 is installed, a removable door 120 is mounted to a pair of hinges 105 of second sidewall 114. This allows for an easier and improved installation process of first enclosure 100 in the desired location without door 120 hindering the installation process. FIG. 2 shows door 120 in a closed and locked position. Door 120 is steel, mesh or plexiglass depending on the particular desired application.

First enclosure 100 provides a security solution to only the section of TIA/EIA rack space that is needed and can be mounted on a backboard or either the front or rear of a TIA/EIA rack to restrict access. The installation of first enclosure 100 over existing cabling components does not require re-termination of patch panels (not shown) to install first enclosure 100. Accordingly, first enclosure 100 provides for a retro-fit of a loaded equipment rack or backboard with the added security of a lockable door 120.

Top plate 102 further comprises a U-shaped perforated knock-out 104. Similarly, bottom plate 112 further comprises a U-shaped perforated knock-out 112. Knock-outs 104, 112 are configured so that first enclosure 100 can be mounted over pre-terminated (existing) voice and data cabling without disconnection and re-terminating connections by removing knockouts 104, 112 creating apertures to route existing cabling. In alternative embodiments, the U-shaped perforated knock-outs of the preferred embodiment are square, rectangular and other various shapes.

First sidewall 106 and second sidewall 114 each further comprise a pair of U-shaped perforated knock-outs 108, 116 that can be removed, if desired, to accommodate voice and data cabling that is in electrical communication with equipment contained within first enclosure 100. In alternative embodiments, the size and number of knock-outs are varied to accommodate specific installations.

Figure 3:
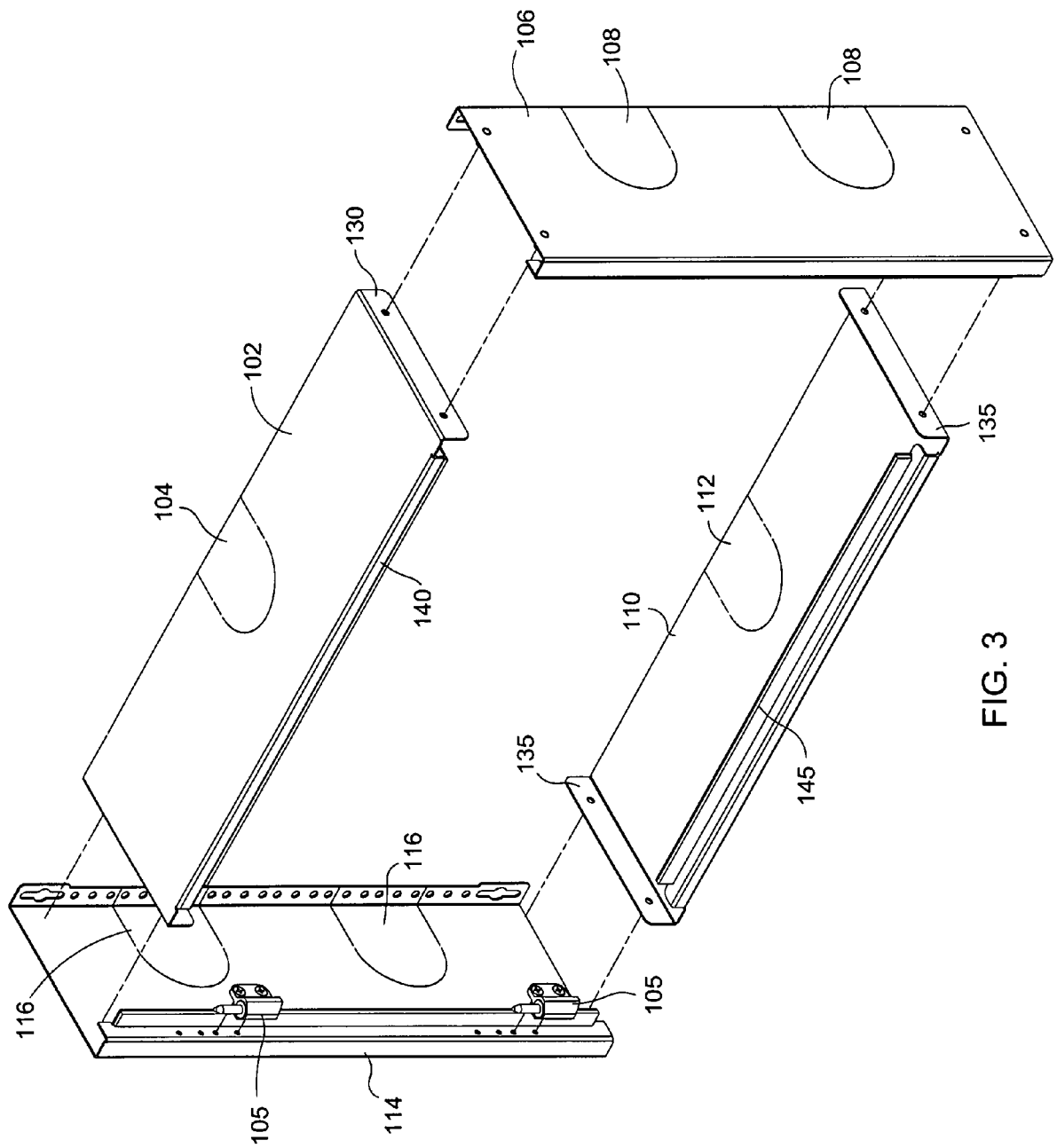
FIG. 3 is an exploded view of a first enclosure of the present invention shown without a door.

Referring now to FIG. 3, top plate 102 has a pair of perpendicular flanges turned downward and used as mating surfaces to first ends of first sidewall 106 and second sidewall 114. Similarly, bottom plate 110 has a pair of perpendicular flanges turned upward and used as mating surfaces to second ends of first sidewall 106 and second sidewall 114. A top door stop 140 is disposed longitudinally along a front edge of top plate 102 and a bottom door stop 145 is disposed longitudinally along a front edge of bottom plate 110. Accordingly, door 120 is secure to front of first enclosure 100 when in a closed position and in contact with door stops 140, 145. A locking means 150 such as a latch and key is used to prevent unauthorized access to first enclosure 100.

FIG. 4 shows a rear view of first enclosure 100, a first perpendicular mounting flange 122 is disposed along a rear edge of first sidewall 106. Similarly, a second perpendicular flange 124 is disposed along a rear edge of second sidewall 114. Mounting flanges 122, 124 each further comprise a row of identical round apertures 125. This allows for a bolt or screw to be used to mount first enclosure 100 to a backboard. As shown in FIG. 5, a slotted aperture 126 is disposed at the end of each row of round apertures so that first enclosure 100 can be easily hung on a bolt attached to a backboard or TIA/EIA rack.

Figure 6:
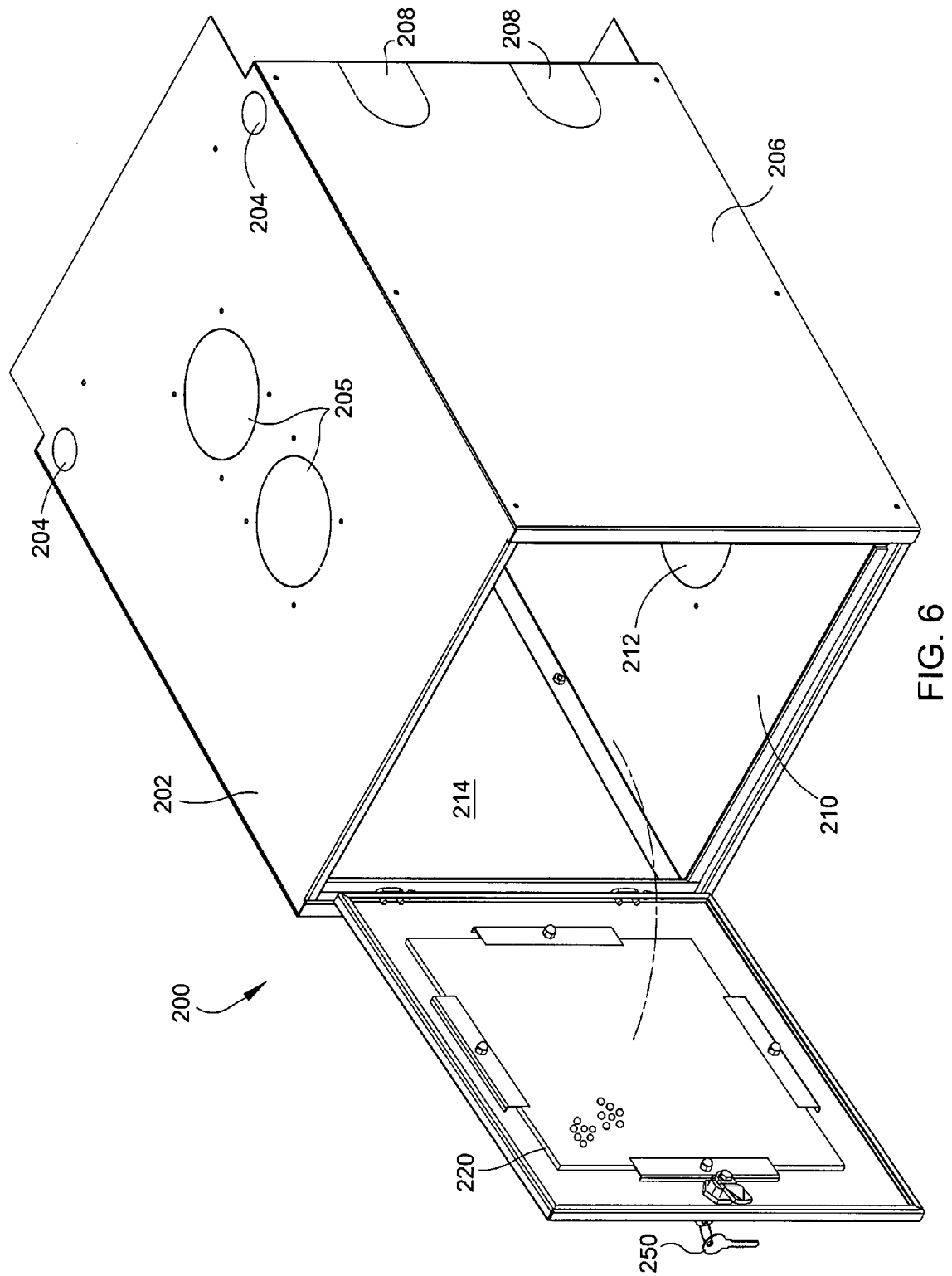
FIG. 6 is a perspective view of a second enclosure of the present invention in an open position.
Figure 7:
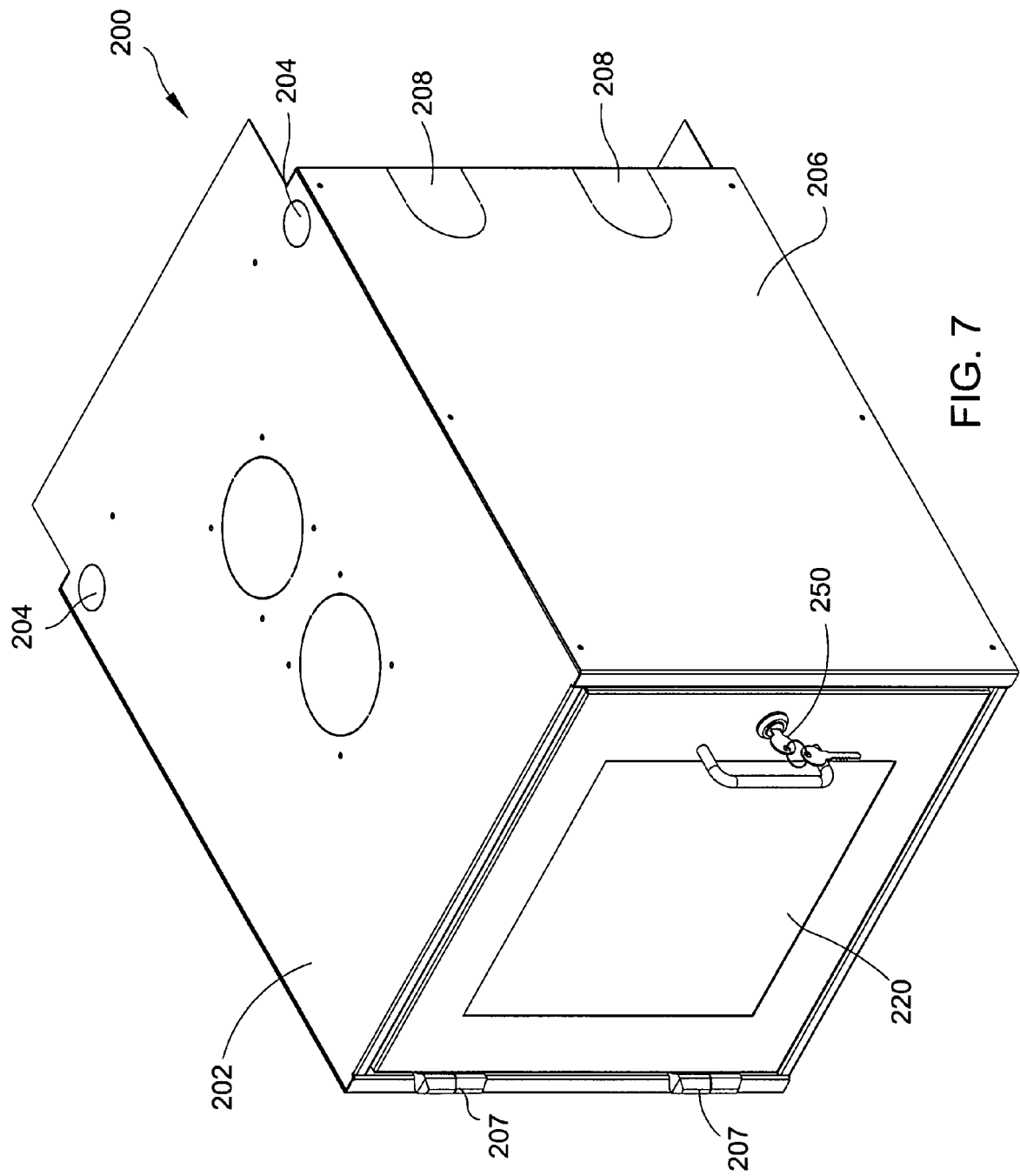
FIG. 7 is a perspective view of second enclosure of the present invention in a closed position.

Referring now to FIG. 6, a second enclosure 200 is sized so that it can be placed over desired electronic equipment mounted on a TIA/EIA rack. The second enclosure 200 has a top plate 202, a bottom plate 210, a first sidewall 206 and opposing second sidewall 214. A removable door 220 is mounted to a pair of hinges 207 of second sidewall 214. FIG. 7 shows door 220 in a closed and locked position.

Top plate 202 further comprises a pair of circular shaped perforated knock-outs 205 disposed such that a fan or a pair of fans can be installed in circular knock-outs 205. Another pair of smaller circular shaped perforated conduit knock-outs 204 are also provided thereon. Similarly, bottom plate 210 further comprises a pair of circular shaped perforated knock-outs and a pair of smaller circular shaped perforated conduit knock-outs 203.

First sidewall 206 and second sidewall 214 each further comprise a pair of U-shaped perforated knock-outs 203, 216 that can be removed, if desired, to accommodate voice and data cabling that is in electrical communication with equipment contained within second enclosure 200. In alternative embodiments, the size and number of knock-outs are varied to accommodate specific installations. Knock-outs 208, 216 are configured so that second enclosure 200 can be mounted over pre-terminated (existing) voice and data cabling without disconnection, and re-terminating connections by removing knockouts 208, 216 creating apertures.

Figure 8:
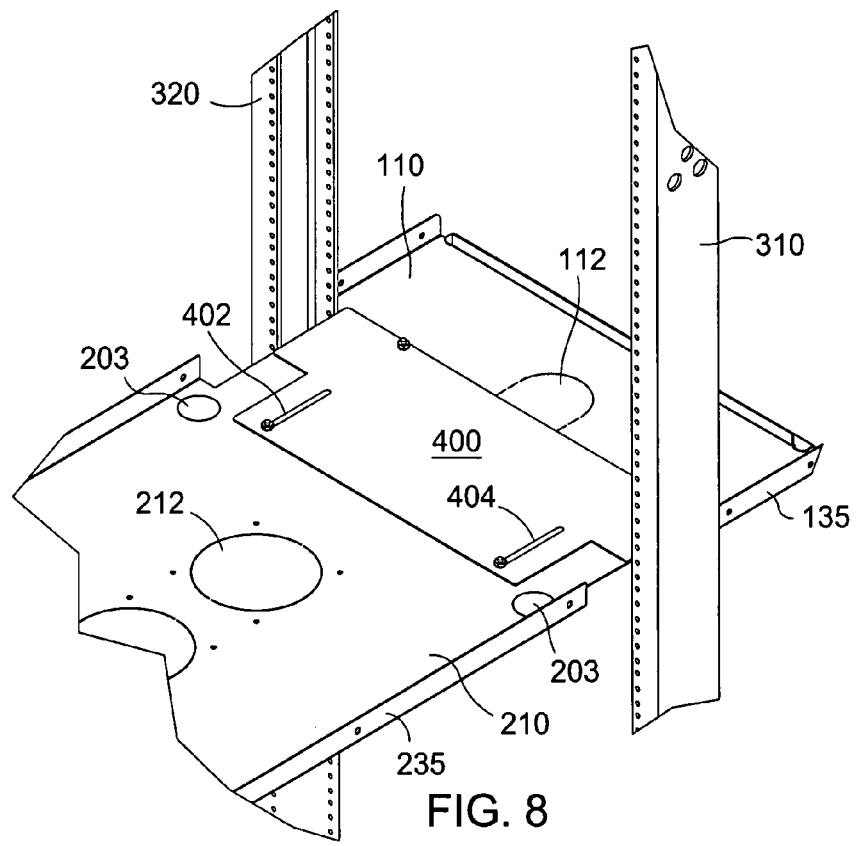
FIG. 8 is a perspective view of an adjustment plate of the present invention.
Figure 9:
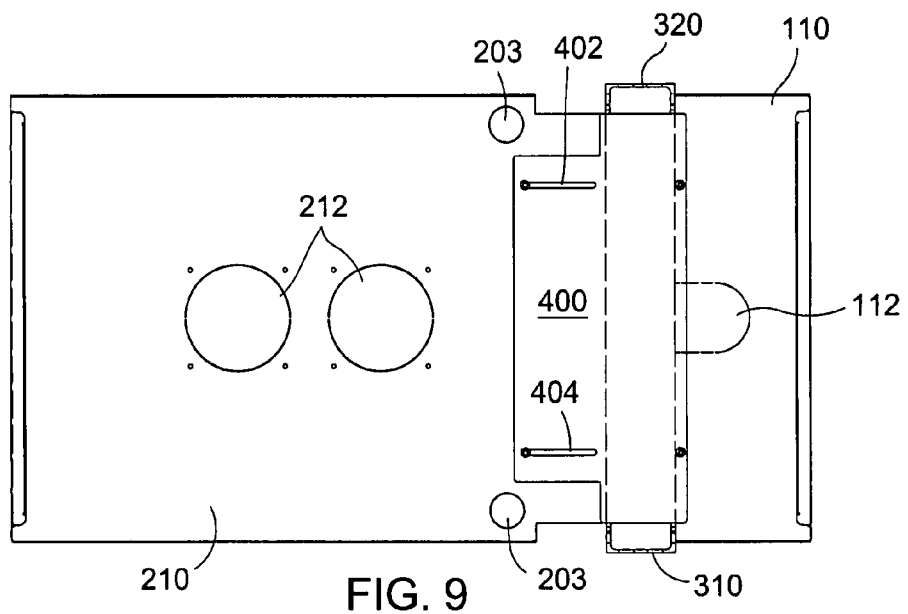
FIG. 9 is a top view of an adjustment plate of the present invention.

FIG. 8 and FIG. 9 show a bottom plate 110 of first enclosure 100 on a rear side of rack side rails 310, 320. Bottom plate 210 of second enclosure 200 is shown on a front side of rack rails 310, 320. Interposed between bottom plate 110 of first enclosure 100 and bottom plate 210 of second enclosure 200 is a bottom adjustment plate 400. A pair of slots 402, 404 are disposed on bottom adjustment plate 400 that allow second enclosure 200 to mount to an TIA/EIA rack with either 3 inch or 6 inch rack rails 310, 320.

Figure 10:
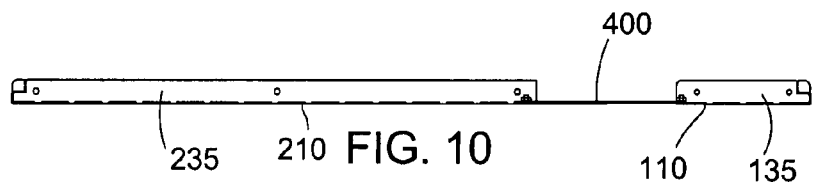
FIG. 10 is a side view of an adjustment plate of the present invention.

Referring now to FIG. 10, bottom adjustment plate 400 is shown secured and interposed between second enclosure bottom plate 210 and first enclosure bottom plate 110 forming a contiguous bottom member. Similarly, a top adjustment plate (not shown) is interposed between second enclosure top plate 202 and first enclosure top plate 102.

Figure 11:
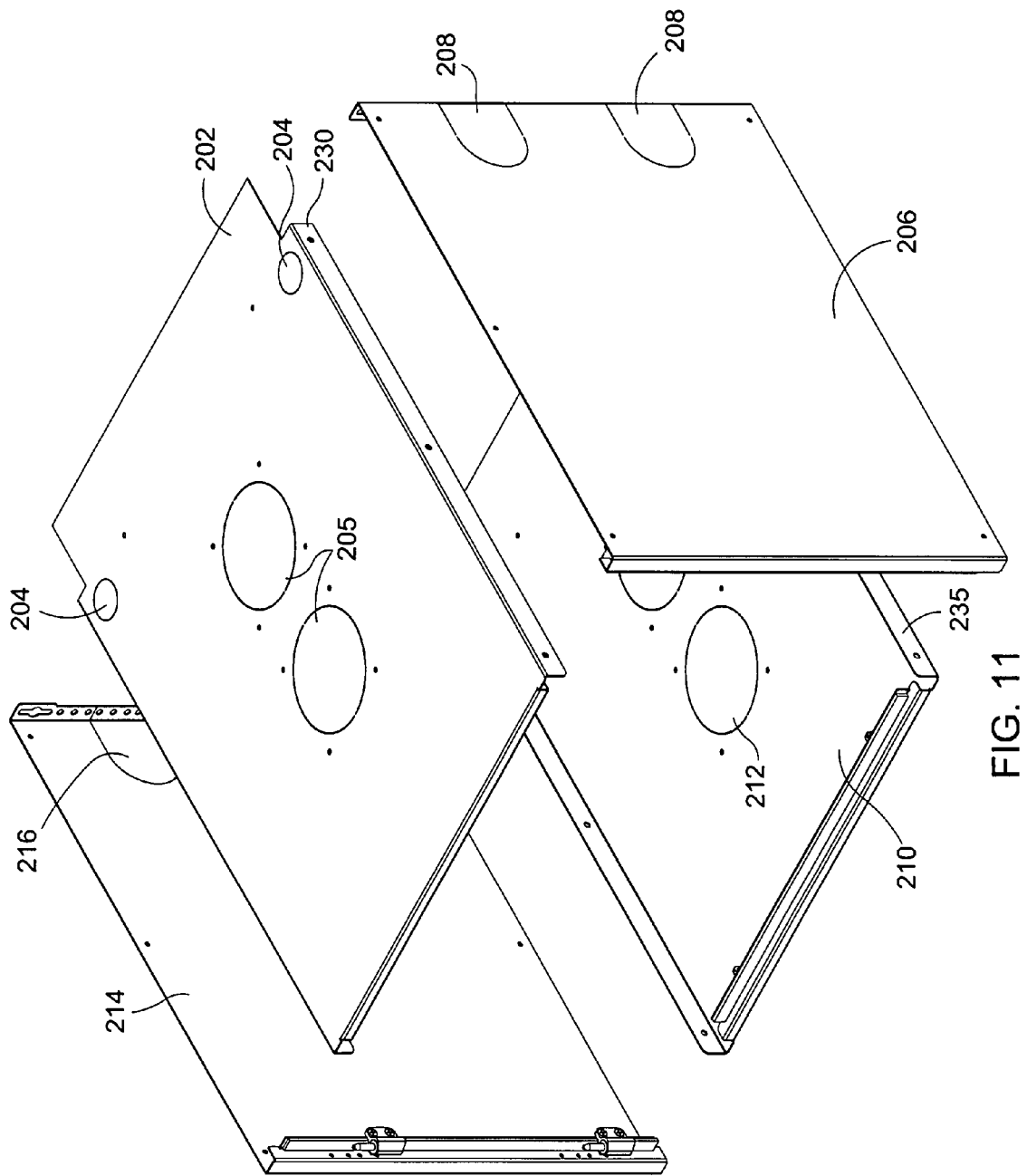
FIG. 11 is an exploded view of second enclosure of the present invention.

FIG. 11 shows a top plate 202 having a pair of perpendicular flanges 230 turned downward and used as mating surfaces to first ends of first sidewall 206 and second sidewall 214. Similarly, bottom plate 210 has a pair of perpendicular flanges 235 turned upward and used as mating surfaces to second ends of first sidewall 206 and second sidewall 214. A top door stop 240 is disposed longitudinally along a front edge of top plate 202 and a bottom door stop 245 is disposed longitudinally along a front edge of bottom plate 210. Accordingly, door 220 is secure to front of second enclosure 200 when in a closed position and in contact with door stops 240, 245. A locking means 250 such as a latch and key is used to prevent unauthorized access to second enclosure 200.

Figure 12:
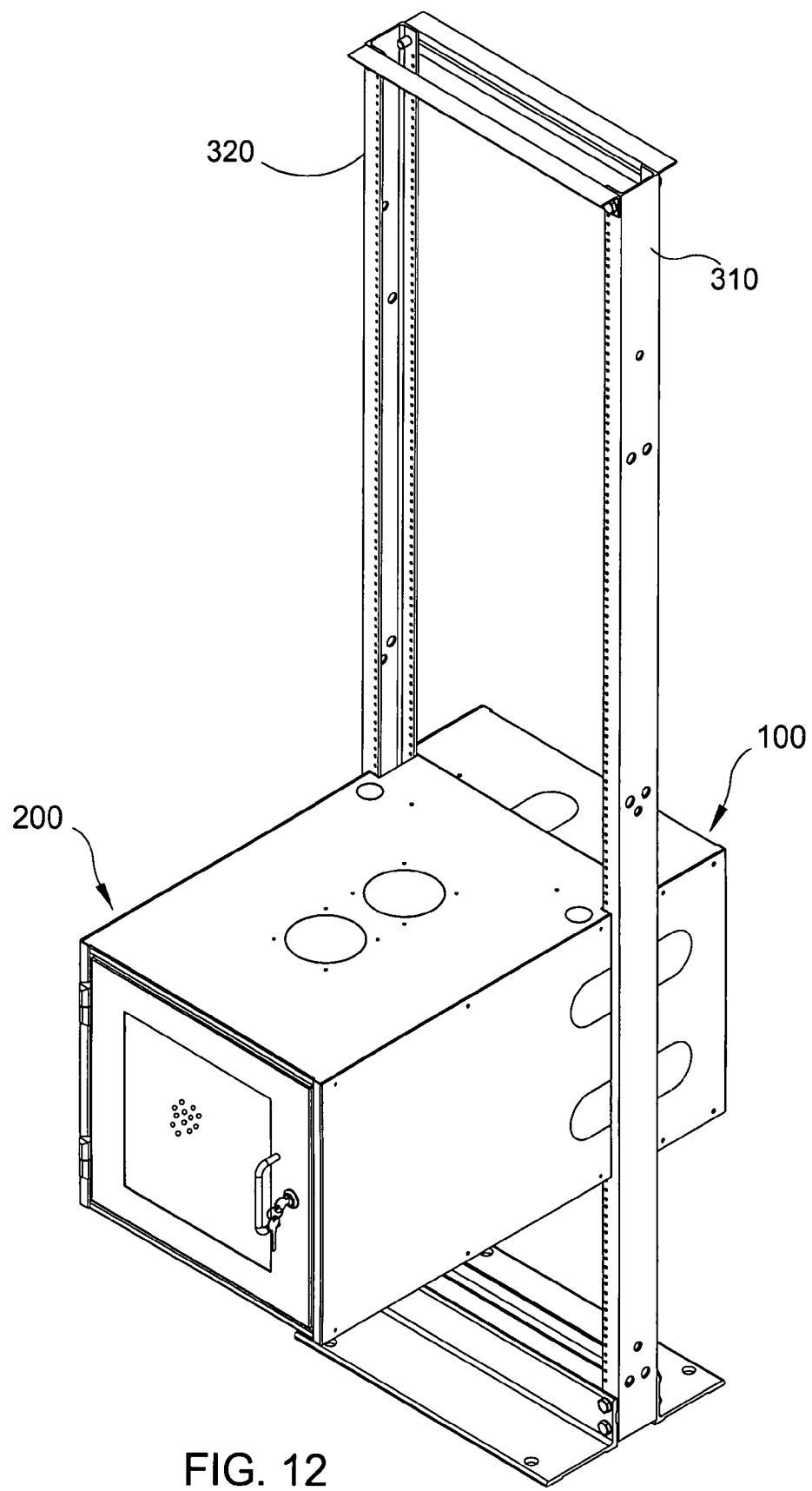
FIG. 12 is a perspective view of the present invention mounted on a TIA/EIA rack.
Figure 13:
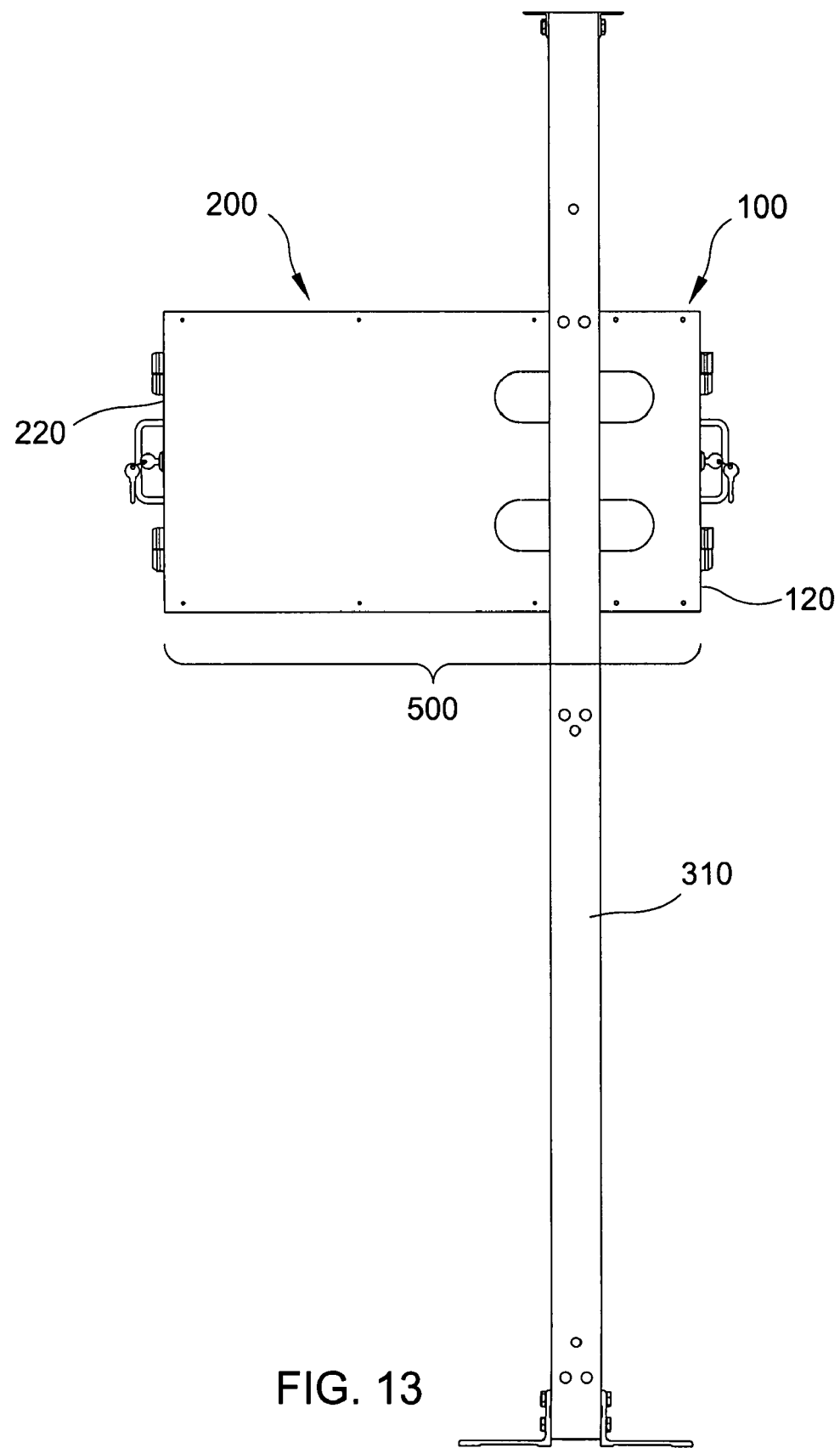
FIG. 13 is a side view of the present invention mounted on a TIA/EIA rack.

FIG. 12 and FIG. 13 show the enclosure system 500 with first enclosure 100 mounted to a first side of TIA/EIA rack rails 310, 320 and a second enclosure 200 mounted to the opposing second side of the TIA/EIA rack rails 310, 320. Doors 120, 220 are in the closed position providing for a secure enclosure for rack mounted low voltage system (not shown).

Figure 14:
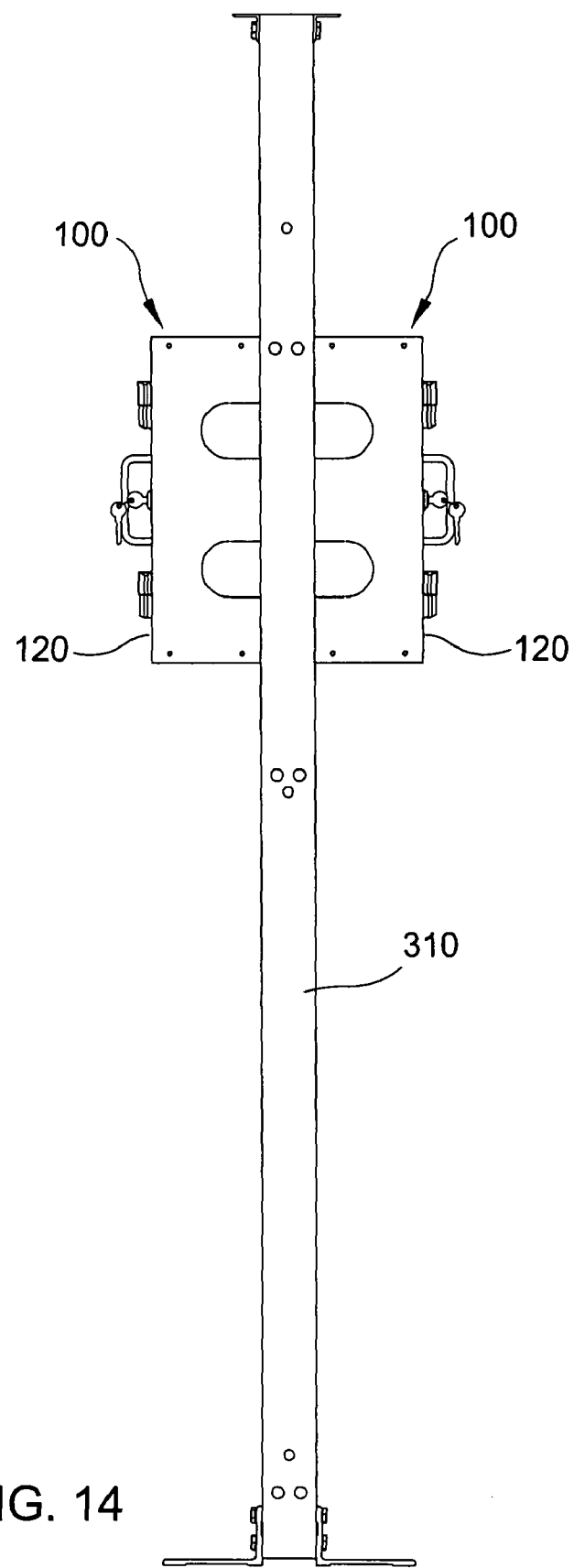
FIG. 14 is a side view of an alternative embodiment of the present invention mounted on a TIA/EIA rack.

FIG. 14 shows an alternative embodiment of the present invention. In this embodiment, the enclosure system includes a first enclosure mounted to both a first side of the TIA/EIA rack rails 310, 320 and a second side of the rack rails 310, 320.

The particular embodiments disclosed above and in the drawings are illustrative only, as the invention may be modified and practiced in different but equivalent manners apparent to those skilled in the art having the benefit of the teachings herein. Furthermore, no limitations are intended to the details of construction or design herein shown. It is therefore evident that the particular embodiments disclosed above may be altered or modified and all such variations are considered within the scope and spirit of the invention.

It is also to be understood that the following claims are intended to cover all of the generic and specific features of the invention herein described, and all statements of the scope of the invention, which as a matter of language, might he said to fall therebetween.

Now that the invention has been described.

What is claimed is;

1. A telecommunications enclosure system comprising:
a first enclosure having a first top plate, a first bottom plate parallel and opposing said top plate, a first sidewall disposed perpendicular between said top plate and said bottom plate, and a second sidewall parallel and opposing said first side wall and disposed perpendicular between said top plate and said bottom plate to define a first rectangular aperture therein; said first sidewall and said second sidewall of said first enclosure having a pair of mounting flanges inside the first enclosure, wherein each said pair of mounting flanges comprises a row of round apertures with a slotted aperture disposed at an end of each row of said round apertures adapted to mount said first enclosure to a backboard or equipment rack rails enclosing equipment installed on the equipment rack rails; a plurality of U-shaped perforated knock-outs disposed adjacent to an edge of said first enclosure to route existing cabling outside said first enclosure; wherein the first enclosure is adapted to fit independently over the equipment installed on the equipment rack rails;
a first removable door hingedly attached to said second sidewall of said first enclosure to control access to said first rectangular aperture and said pre-selected equipment contained therein from a front side;
a second enclosure having a top plate, a bottom plate parallel and opposing said top plate, a first sidewall disposed perpendicular between said top plate and said bottom plate, and a second sidewall parallel and opposing said first sidewall and disposed perpendicular between said top plate and said bottom plate to define a second rectangular aperture; said first sidewall and said second sidewall of said second enclosure having a pair of mounting flanges inside the second enclosure, wherein each said pair of mounting flanges comprises a row of round apertures with a slotted aperture disposed at an end of each row of said round apertures adapted to mount said second enclosure to said backboard or said equipment rack rails; a plurality of U-shaped perforated knock-outs disposed adjacent to an edge of said second enclosure to route existing cabling outside said second enclosure; wherein the second enclosure is adapted to fit independently over the equipment installed on the equipment rack rails; and a second door hingedly attached to said second sidewall of said second enclosure to control access to said second rectangular aperture and said pre-selected equipment from a back side;

a bottom adjustment plate to bridge a bottom gap between a bottom of said first enclosure and said second enclosure when said first and second enclosures are mounted to opposing sides of said equipment rack rails, wherein said bottom adjustment plate is adjusted to accommodate a depth of said equipment rack rails; and a top adjustment plate to bridge a top gap between a top of said first enclosure and said second enclosure when said first and second enclosures are mounted to opposing sides of said equipment rack rails, wherein said top adjustment plate is adjusted to accommodate a depth of said equipment rack rails.

2. The telecommunications enclosure system of claim 1 further comprising a locking mechanism to secure said door of said first enclosure.

3. The telecommunications enclosure system of claim 1 wherein said door further comprising a mesh insert to improve air circulation within said first enclosure.

4. The telecommunications enclosure system of claim 1, wherein said top plate further comprising a pair of perpendicular flanges turned downward and said bottom plate further comprising a pair of perpendicular flanges turned upward to secure said first sidewall and said second sidewall together.

5. The telecommunications enclosure system of claim 4, wherein said top plate further comprising a top door stop disposed longitudinally along a front edge of said top plate and said bottom plate further comprising a bottom door stop disposed longitudinally along a front edge of said bottom plate to secure said door to front of said first enclosure when in a closed position and in contact with said top door stop and said bottom door stop.

6. The telecommunications enclosure system of claim 1, wherein said top plate of said second enclosure further comprising at least one perforated circular shaped knock-out and said bottom plate of said second enclosure further comprising at least one perforated circular shaped knock-out to install a fan assembly therein to improve air circulation and cooling within said second enclosure.

7. The telecommunications enclosure system of claim 1, wherein said equipment rack rails are three inches in depth.

8. The telecommunications enclosure system of claim 1, wherein said equipment rack rails are six inches in depth.

9. The telecommunications enclosure system of claim 1 further comprising a telecommunications backboard for mounting said first enclosure thereon over low voltage system equipment.

10. The telecommunications enclosure system of claim 1, wherein said top plate of said second enclosure and said bottom plate of said second enclosure extend beyond said first sidewall and second sidewall at a rear side of said second enclosure so that when second enclosure is mounted to an equipment rack rails said top plate and said bottom plate completely seal off the area between said rack rails.

11. The telecommunications enclosure system of claim 1 further comprising a locking mechanism so that said door of said second enclosure can be secured in a closed position.

12. The telecommunications enclosure system of claim 1, wherein said door further comprising a mesh insert to improve air circulation within said second enclosure.

13. A telecommunications enclosure system comprising:

a first enclosure adapted to mount to a front side of equipment rack rails independent of equipment installed on the equipment rack rails, wherein the first enclosure is mounted to the equipment rack rails using a pair of mounting flanges inside the first enclosure;

at least one U-shaped knock-out disposed adjacent to a rear edge of the first enclosure, wherein the at least one U-shaped knock-out is removed to route cabling to the first enclosure;

a first removable door hingedly secured to a front side of the first enclosure to control access to an interior of the first enclosure;

a second enclosure adapted to mount to an opposing rear side of the equipment rack rails independent of the equipment installed on the equipment rack rails, wherein the second enclosure is mounted to the equipment rack rails using a pair of mounting flanges inside the second enclosure;

at least one U-shaped knock-out disposed adjacent to a rear edge of the second enclosure, wherein the at least one U-shaped knock-out is removed to route cabling to the second enclosure;

a second removable door hingedly secured to a front side of the second enclosure to control access to the interior of the second enclosure;

a bottom adjustment plate to bridge a bottom gap between a bottom of the first enclosure and the second enclosure when the first and second enclosures are mounted to opposing sides of the equipment rack rails, wherein the bottom adjustment plate is adjusted to accommodate a depth of the equipment rack rails; and a top adjustment plate to bridge a top gap between a top of the first enclosure and the second enclosure when the first and second enclosures are mounted to opposing sides of the equipment rack rails, wherein the top adjustment plate is adjusted to accommodate a depth of the equipment rack rails.

* * * * *